US012754254B2

(12) United States Patent
Yamane et al.

(10) Patent No.: US 12,754,254 B2
(45) Date of Patent: Oct. 6, 2026

(54) METHOD OF ESTIMATING LIFE OF NICKEL-METAL HYDRIDE BATTERY

(71) Applicant: FDK CORPORATION, Tokyo (JP)

(72) Inventors: Tetsuya Yamane, Tokyo (JP); Tetsu Yamanaka, Tokyo (JP); Masanori Tamura, Tokyo (JP); Hideyuki Asanuma, Tokyo (JP)

(73) Assignee: FDK CORPORATION, Tokyo (JP)

( * ) Notice: Subject to any disclaimer, the term of this patent is extended or adjusted under 35 U.S.C. 154(b) by 413 days.

(21) Appl. No.: 18/475,889

(22) Filed: Sep. 27, 2023

(65) Prior Publication Data

US 2024/0118348 A1 Apr. 11, 2024

(30) Foreign Application Priority Data

Sep. 29, 2022 (JP) ................................ 2022-156540

(51) Int. Cl.
*G01R 31/392* (2019.01)
*G01R 31/367* (2019.01)
*G01R 31/378* (2019.01)

(52) U.S. Cl.
CPC ......... *G01R 31/392* (2019.01); *G01R 31/367* (2019.01); *G01R 31/378* (2019.01)

(58) Field of Classification Search
CPC ...... G01R 31/367; G01R 31/392; G01R 1/00; G01R 3/00; G01R 5/00; G01R 7/00;
(Continued)

(56) References Cited

U.S. PATENT DOCUMENTS 6,329,099 B1 * 12/2001 Oyama ............. H01M 10/3909 429/104
11,500,027 B2 * 11/2022 Kim .................. G01R 31/3644
(Continued)

FOREIGN PATENT DOCUMENTS

| | | | |
|---|---|---|---|
| EP | 0273624 | B1 | 8/1993 |
| JP | H08236111 | A | 9/1996 |
| WO | 2006013881 | A1 | 2/2006 |

OTHER PUBLICATIONS

Extended European Search Report dated Mar. 20, 2024, for European Patent Application No. 23199722.2.

*Primary Examiner* — Daniel Previl
(74) *Attorney, Agent, or Firm* — Kinney & Lange, P.A.

(57) ABSTRACT

A method of estimating life of a nickel-metal hydride battery that accommodates a positive electrode plate and a negative electrode plate facing the positive electrode plate with a separator therebetween and containing a hydrogen absorbing alloy together with an electrolyte is disclosed. A charge phase of charging the nickel-metal hydride battery and a discharge phase of discharging the nickel-metal hydride battery after the charge phase constitutes one cycle for charge/discharge of the nickel-metal hydride battery. The method includes: determining a rate of change after one charge/discharge cycle of a surface area of the negative electrode plate which is a boundary face in contact with the electrolyte, and determining an amount of corrosion of the hydrogen absorbing alloy based on the rate of change accumulated for n charge/discharge cycles to estimate the life of the nickel-metal hydride battery based on the amount of corrosion.

2 Claims, 2 Drawing Sheets

(58) Field of Classification Search

CPC .......... G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00; G01R 31/378; B60L 2200/32; B60L 2240/545; B60L 58/16; B60L 1/00; B60L 3/00; B60L 5/00; B60L 7/00; B60L 8/00; B60L 9/00; B60L 13/00; B60L 15/00; B60L 50/00; B60L 53/00; B60L 55/00; B60L 58/00; B60L 2200/00; B60L 2210/00; B60L 2220/00; B60L 2240/00; B60L 2250/00; B60L 2260/00; B60L 2270/00; B60Y 2200/91; B60Y 2200/00; B60Y 2300/00; B60Y 2302/00; B60Y 2304/00; B60Y 2306/00; B60Y 2400/00; B60Y 2410/00; B63B 79/00; B63B 1/00; B63B 3/00; B63B 5/00; B63B 7/00; B63B 11/00; B63B 13/00; B63B 15/00; B63B 17/00; B63B 19/00; B63B 21/00; B63B 22/00; B63B 23/00; B63B 25/00; B63B 27/00; B63B 29/00; B63B 32/00; B63B 34/00; B63B 35/00; B63B 41/00; B63B 39/00; B63B 43/00; B63B 45/00; B63B 49/00; B63B 51/00; B63B 57/00; B63B 59/00; B63B 69/00; B63B 71/00; B63B 73/00; B63B 75/00; B63B 77/00; B63B 81/00; B63B 83/00; B63B 85/00; B63B 2201/00; B63B 2203/00; B63B 2205/00; B63B 2207/00; B63B 2209/00; B63B 2211/00; B63B 2213/00; B63B 2221/00; B63B 2231/00; B63B 2241/00; B63J 99/00; B63J 1/00; B63J 2/00; B63J 3/00; B63J 4/00; G06F 30/20; G06F 1/00; G06F 3/00; G06F 5/00; G06F 7/00; G06F 8/00; G06F 9/00; G07C 5/04; G07C 5/085; G07C 1/00; G07C 3/00; G07C 5/00; G07C 7/00; G07C 9/00; G07C 11/00; G07C 13/00; G07C 15/00; G07C 2205/00; G07C 2209/00; H01M 10/4285; H01M 10/48; H01M 10/482; H01M 2220/20; H01M 10/425; H01M 2010/4271; H01M 4/00; H01M 6/00; H01M 8/00; H01M 10/00; H01M 12/00; H01M 14/00; H01M 16/00; H01M 50/00; H01M 2200/00; H01M 2220/00; H01M 2250/00; H01M 2300/00; H01M 4/242; H01M 4/383; H01M 4/52; H01M 10/30; H01M 10/345; H01M 4/38; H01M 4/62; H01M 10/26; H01M 4/26; H01M 4/364; H01M 4/48; H01M 50/107; H01M 50/533; H01M 50/538; H01M 10/347; H01M 4/0404; H01M 4/049; H01M 4/32; H01M 4/362; H01M 4/366; H01M 4/382; H01M 4/385; H01M 4/46; H01M 10/054; H01M 10/10; H01M 10/342; H01M 10/42; H01M 10/446; H01M 12/085; H01M 2004/021; H01M 2004/028; H01M 2006/5094; H01M 4/0445; H01M 4/131; H01M 4/485; H01M 4/505; H01M 4/525; H01M 4/56; H01M 4/685; H01M 4/86; H01M 50/383; H01M 50/463; H01M 8/04276; H01M 8/184; H01M 8/22; Y02E 60/10; Y02E 10/00; Y02E 20/00; Y02E 30/00; Y02E 40/00; Y02E 50/00; Y02E 60/00; Y02E 70/00; Y02E 60/32; Y02E 60/50; Y02E 10/10; Y02E 30/30; Y02E 60/36; Y02T 10/70; Y02T 10/00; Y02T 30/00; Y02T 50/00; Y02T 70/00; Y02T 90/00; C01B 3/0057; C01B 13/0259; C01B 2203/0415; C01B 2203/042; C01B 2203/043; C01B 2203/0455; C01B 2203/047; C01B 2203/0475; C01B 2203/048; C01B 2203/0485; C01B 2210/0014; C01B 2210/0046; C01B 3/0031; C01B 3/045; C01B 3/52; C01B 3/56; C01B 5/00; C01B 3/00; C01B 4/00; C01B 6/00; C01B 7/00; C01B 9/00; C01B 11/00; C01B 13/00; C01B 15/00; C01B 17/00; C01B 19/00; C01B 21/00; C01B 23/00; C01B 25/00; C01B 32/00; Y02P 70/50; Y02P 30/00; B01J 23/96; B01J 21/18; B01J 21/185; B01J 23/10; B01J 23/745; B01J 35/56; B01J 37/0215; B01J 37/086; B01J 37/16; B01J 23/70; B01J 27/04; B01J 38/44; B01D 53/9413; B01D 61/44; B01D 61/58; B01D 2256/12; B01D 2256/16; B01D 2256/24; B01D 2256/245; B01D 2257/102; B01D 2257/304; B01D 2257/7022; B01D 2257/7027; B01D 2257/708; B01D 53/0462; B01D 53/047; B01D 53/1418; B01D 53/261; B01D 53/52; B82Y 30/00; C01F 7/784; C01F 7/785; C01P 2002/22; C01P 2002/72; C01P 2004/03; C01P 2004/04; C01P 2004/61; C01P 2004/62; C01P 2006/12; C01P 2006/82; C04B 22/06; C04B 26/26; C10G 35/09; C10G 1/086; C10G 35/085; C10G 49/12; C10G 70/046; F01N 3/10; C01G 45/1221; C01G 49/0027; C01G 49/0072; Y10S 420/90; C02F 5/083; C07C 11/04; C07C 11/06; C07C 7/005; C07C 7/04; C07C 7/11; C07C 7/12; C07C 9/04; C10K 1/002; C10K 1/004; C10K 1/02; C10K 1/04; C10K 1/08; C10K 1/18; C10K 1/20; C10K 1/32; C10L 2290/542; C10L 3/101; C10L 3/103; C22C 1/1047; C23F 11/04; C23F 11/122; C25B 1/02; C25B 1/04; C25B 1/135; C25B 15/00; C25B 9/65; C25B 9/67; F02C 1/00; F24T 10/20; F25J 2205/64; F25J 3/0238; F25J 3/0242; G21C 1/08; G21C 1/24; G21C 19/317; Y02C 20/20; Y10T 428/12486

USPC ............. 340/539.3, 636.19, 7.32, 7.53, 7.55, 340/10.34, 425.2, 815.69, 815.73, 815.79, 340/393.3

See application file for complete search history.

(56) References Cited

U.S. PATENT DOCUMENTS

| | | | | |
|---|---|---|---|---|
| 2017/0038436 | A1 * | 2/2017 | Montaru .............. | G01R 31/367 |
| 2020/0009988 | A1 * | 1/2020 | Basler .................. | H01M 10/48 |
| 2020/0295348 | A1 * | 9/2020 | Yamaguchi ......... | H01M 4/1391 |

(56) References Cited

U.S. PATENT DOCUMENTS

2021/0215766 A1* 7/2021 Ji .......................... G01R 31/367
2023/0327224 A1* 10/2023 Zeiler ................. H01M 10/482
429/93

* cited by examiner

METHOD OF ESTIMATING LIFE OF NICKEL-METAL HYDRIDE BATTERY

CROSS-REFERENCE TO RELATED APPLICATION(S)

The present application claims priority to Japanese Application No. 2022-156540 filed on Sep. 29, 2022, the contents of which are incorporated by reference herein in their entirety.

BACKGROUND

Technical Field

The present disclosure relates to a method of estimating life of nickel-metal hydride batteries.

Description of the Related Art

Nickel-metal hydride batteries are used in a variety of applications and used as a backup power source and an automotive power supply in industrial applications. Therefore, a longer service life of nickel-metal hydride batteries is required to ensure the long-term reliability and reduction of the frequency of battery pack replacement. Meanwhile, since a considerable period of time is required to actually evaluate a battery, a method of estimating a battery life is needed.

International Publication No. WO 2006/013881 discloses a method of estimating a battery life by evaluating a battery for each environmental temperature and charge/discharge condition and using an empirical formula. Since nickel-metal hydride batteries deteriorate due to corrosion of the hydrogen absorbing alloy used as the negative electrode, the amount of the corrosion of the negative electrode was empirically formulated into a mathematical formula, and the battery life was estimated in accordance with the amount of the corrosion.

Conventional methods of estimating battery life are empirical methods that focus on temporal changes in battery voltage and internal resistance. Therefore, the estimation with high precision was difficult under conditions in which the frequency of charge/discharge cycles or environmental temperature changes over time.

On the other hand, the estimation considering corrosion of the negative electrode is based on actual data and therefore conducted with high precision under actual measurement conditions. However, in the same way as the estimation based on changes over time in battery voltage and internal resistance, it was difficult with this method to estimate battery life with high precision when the frequency of charge/discharge cycles or environmental temperature changes over time.

An object of the present disclosure is to provide a method of estimating life of nickel-metal hydride batteries with high precision, even when the frequency of charge/discharge cycles or environmental temperature changes over time.

SUMMARY

In order to achieve the above object, the present disclosure features a method of estimating life of a nickel-metal hydride battery that accommodates a positive electrode plate and a negative electrode plate facing the positive electrode plate with a separator therebetween and containing a hydrogen absorbing alloy together with an electrolyte. A charge phase charging the nickel-metal hydride battery and a discharge phase discharging the nickel-metal hydride battery after the charge phase constitute one cycle for charge/discharge of the nickel-metal hydride battery. The method includes: determining a rate of change after one charge/discharge cycle of a surface area of the negative electrode plate which is a boundary face in contact with the electrolyte, and determining an amount of corrosion of the hydrogen absorbing alloy based on the rate of change accumulated for n charge/discharge cycles to estimate the life of the nickel-metal hydride battery based on the amount of corrosion.

The method of the present disclosure allows for more precise estimation of battery life.

DETAILED DESCRIPTION

The method of estimating life of nickel-metal hydride batteries according to embodiments of the present disclosure will be described below.

1. Battery Configuration

Figure 1:
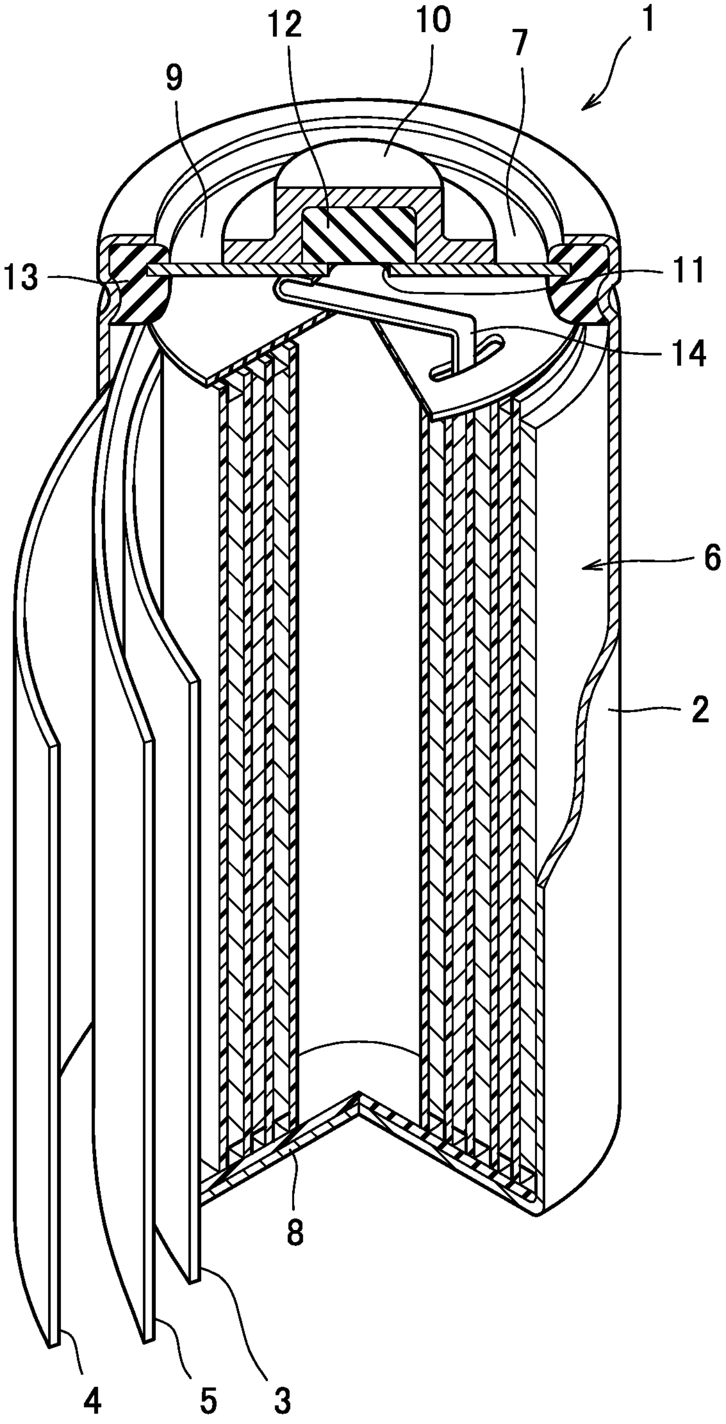
FIG. 1 is a perspective view showing a nickel-metal hydride battery according to one embodiment in which a part thereof is cut off.

FIG. 1 shows a nickel-metal hydride battery (hereinafter referred to as "battery") 1 whose life is to be estimated. The battery is a secondary battery cell having a specified battery capacity of AA size cylindrical shape. In the battery 1, an electrode group 6 including a positive electrode plate 3 and a negative electrode plate 4 are accommodated in an outer package can 2 together with an alkaline electrolyte. The outer package can 2 has a bottomed cylindrical shape with an opening at an upper end. The opening at the upper end of the outer package can 2 is sealed with a sealing member 7. The electrode group 6 is configured to have a separator 5 placed between the positive electrode plate 3 and the negative electrode plate 4 and then to have the positive electrode plate 3 and the negative electrode plate 4 spirally wound.

The outer package can 2 has a bottom wall 8 that is conductive and serves as a negative electrode terminal. The sealing member 7 includes a cover plate 9 and a positive electrode terminal 10. The cover plate 9 is conductive and has a gas vent hole 11 in the center. A rubber valve member 12 that seals the gas vent hole 11 is placed on the outer surface of the cover plate 9. The cover plate 9 is placed at the opening end of the outer package can 2 through a ring-shaped gasket 13. The cover plate 9 closes the opening of the outer package can 2 by swaging the opening rim of the outer package can 2. The positive electrode terminal 10 is attached to the cover plate 9.

In the electrode group 6, the positive electrode plate 3, the negative electrode plate 4, and the separator 5 are each belt-shaped. Spirally wound with the separator 5 placed between the positive electrode plate 3 and the negative electrode plate 4, the electrode group 6 has a nearly cylindrical shape. The positive electrode plate 3 and the negative electrode plate 4 face each other with the separator 5 placed therebetween and are stacked in a radial direction of the outer package can 2.

In the outer package can 2, a positive electrode lead 14 is arranged between one end of the electrode group 6 and the cover plate 9. Each end of the positive electrode lead 14 is electrically connected to the positive electrode plate 3 and the cover plate 9, respectively.

The positive electrode plate 3 includes a conductive positive electrode substrate having a porous structure and a positive electrode mixture retained in the pores of the positive electrode substrate and on the surface of the positive electrode substrate. The positive electrode substrate may be formed from a nickel-plated net-like, sponge-like, or fibrous metal member, or a nickel foam.

The positive electrode mixture includes positive electrode active material particles, a conductive material, a positive electrode additive, and a binding agent. The positive electrode active material particles are nickel hydroxide ($Ni(OH)_2$) particles or high-order nickel hydroxide particles. It is preferable to dissolve at least one among zinc, magnesium, and cobalt in the nickel hydroxide particles.

The negative electrode plate 4 includes a conductive negative electrode core member having a belt shape. A negative electrode mixture is applied to the negative electrode core member. The negative electrode core member is made from a metal sheet in which through holes are distributed. A punching ferrous-metal sheet with a nickel-plated surface is used for the negative electrode core member. The negative electrode mixture is applied to the negative electrode core member to form a negative electrode mixture layer.

The negative electrode mixture includes hydrogen absorbing alloy particles (hereinafter referred to as alloy particles), a negative electrode additive, a conductive material, and a binding agent.

The hydrogen absorbing alloy is capable of adsorbing and releasing hydrogen as a negative electrode active material. For the hydrogen absorbing alloy, a common hydrogen absorbing alloy can be used. In this embodiment, a rare earth-Mg—Ni based hydrogen absorbing alloy including a rare earth metal, Mg, and Ni is preferably used.

The separator 5 is formed from a non-woven fabric made of fluorinated or sulfonated polypropylene fiber.

The electrode group 6 is accommodated in the outer package can 2 so that the negative electrode side is in contact with the bottom wall 8 of the outer package can 2.

After a prescribed amount of alkaline electrolyte is poured into the outer package can 2, the opening of the outer package can 2 is closed. The alkaline electrolyte impregnates the positive electrode plate 3, the negative electrode plate 4, and the separator 5 and is involved in electrochemical reaction or so-called charge/discharge reaction between the positive electrode plate 3 and the negative electrode plate 4. An alkaline electrolyte containing NaOH as the main solute is used as the alkaline electrolyte.

An initial activation process is performed to the battery 1 formed as described above so as to make the battery 1 ready for use.

2. Estimation of Battery Life

Next, a method of estimating life of the battery 1 will be described below.

One cycle of a charge/discharge of the battery 1 is a combination of a charge phase, in which the battery is charged to a full charge, and a discharge phase, in which the battery is discharged to a load after charging. The battery 1 repeats this charge/discharge cycle plural times.

When the battery 1 is electrically connected to a load and discharged to the load, the battery 1 terminates discharging when the battery voltage drops to the discharge cut-off voltage. The discharge cut-off voltage is the voltage at which the battery 1 can discharge, and is the battery voltage at which the dischargeable battery capacity becomes 0%. The discharge cut-off voltage of nickel-metal hydride batteries is 1.1 to 0.8 V voltage per cell.

Alternatively, when a control is applied to the battery 1 to keep the battery 1 constantly dischargeable, such as an intermittent charge control, charging of the battery 1 is started before the battery voltage drops to the discharge cut-off voltage due to self-discharge, for example.

As the number of cycles increases, the dischargeable battery capacity decreases and the battery 1 reaches the end of life. It is known that the main reason influencing the degradation of the battery 1 is corrosion of the hydrogen absorbing alloy of the negative electrode, which proceeds as the number of cycles increases. The corrosion of the hydrogen absorbing alloy proceeds not only during charging/discharging of the battery, but also when the battery is not in use such as in a self-discharging state.

Corrosion of the hydrogen absorbing alloy begins on the surfaces of the alloy particles located on the boundary between the alkaline electrolyte and the negative electrode. In addition, on the surface of the alloy particles, cracks are generated due to charge/discharge reaction of the battery 1 to pulverize the alloy particles. As new surfaces of the alloy particles resulting from the pulverization is in contact with the alkaline electrolyte, the new surfaces are subjected to crack generation in the next charge/discharge reaction. Thus, as the number of cycles increases, the alloy particles are further pulverized. Therefore, the total surface area of the alloy particles in contact with the alkaline electrolyte also increases.

The proceeding of corrosion of the alloy particles is estimated separately for a charge/discharge phase and for a standing phase. In the charge/discharge phase, the corrosion proceeds substantively in proportion to the number of cycles. On the other hand, in the standing phase, the corrosion depends on the number of cycles and the elapsed time period since the start of use of the battery 1. Furthermore, the present inventor has found that the corrosion in the standing phase also depends on the increase in the surface area of the alloy particle due to the pulverization.

Therefore, the inventor attempted a modeling of corrosion of the alloy particles, obtained the amount of corrosion of the negative electrode from Formula (1) below, and confirmed that the life of the battery 1 estimated from the amount of corrosion is consistent with the test results described later. The corrosion of the hydrogen absorbing alloy was quantified by measuring saturation magnetization (emu/g) of nickel using a VIBRATING SAMPLE MAGNETOMETER (VSM) equipment that is a vibrating magnetometer.

[Expression 1]

Alloy corrosion — Corrosion in standing phase — Corrosion in charge/discharge phase (1)

$$M = M_0 + A_t\left(1 + \frac{\alpha\left(1 - \sigma^{N_{cyc}}\right)}{1 - \sigma}\right)\sqrt{t}\left[\frac{-Q_t}{R}\left(\frac{1}{T} - \frac{1}{T_{ref}}\right)\right] + A_c N_{cyc}\left[\frac{-Q_c}{R}\left(\frac{1}{T} - \frac{1}{T_{ref}}\right)\right] \tag{1}$$

Each parameter in Formula (1) is as follows:

M: Saturation magnetization of the negative electrode

Mo: Initial saturation magnetization (emu/g). Starting value of the saturation magnetization at the start of battery use (t=0).

At: Corrosion proceeding coefficient per month in the standing phase [emu/g month].

α: Rate of increase in corrosion rate per cycle, provided that it is the value in the first cycle.

σ: Rate of decrease of a per cycle t: Elapsed time period from the start of battery use (total of the periods corresponding to the charge phase, discharge phase, and standing phase), unit is month [month].

T: Environmental temperature, unit is [K].

$T_{ref}$: Reference temperature [K]. Reference temperature for At and Ac.

Ac: Corrosion coefficient per cycle [emu/g cyc].

Ncyc: Number of cycles [cyc].

Qt, Qc: Corrosion proceeded over time, activation energy of corrosion proceeded by charging/discharging [J/mol].

In the right-hand side of Formula (1), the first term represents an initial saturation magnetization at the start of battery use, the second term represents a saturation magnetization due to corrosion in the standing phase, and the third term represents a saturation magnetization due to corrosion in the charge/discharge phase. The saturation magnetization due to corrosion in the standing phase is estimated by multiplying the "corrosion due to elapsed time period" which is known from previous estimates, by the value corresponding to the "increase in the surface area of the alloy particles due to the pulverization". In the present disclosure, the "elapsed time period" is the total time period of the charge phase, the discharge phase, and the standing phase, and is equal to the elapsed time period since the start of battery use.

As previously described, the new surface of the alloy particles generated due to the pulverization is corroded by the subsequent charge/discharge reaction. Existing surfaces of the alloy particles are also cumulatively corroded by the following charge/discharge reactions. Thus, macroscopically, the increase in the surface area of the alloy particles due to the pulverization can be modeled as the sum of geometric sequence, with α, rate of increase in corrosion rate per cycle, as the first term, and σ, rate of decrease in α per cycle, as the common ratio. From Formula (1), a portion (2), which shows the increase in surface area due to the pulverization of the alloy particles, is shown below. It is experimentally confirmed that the rate of increase in the surface area of alloy particles due to the pulverization gradually decreases as the number of cycles increases.

[Expression 2]

$$\left(1 + \frac{\alpha\left(1 - \sigma^{N_{cyc}}\right)}{1 - \sigma}\right) \tag{2}$$

As described above, in calculating the amount of alloy corrosion of the negative electrode, the precision of estimating the amount of alloy corrosion is expected to improve by incorporating the increase in the surface area of alloy particles that occurs during the charge and discharge phases.

3. Comparison of Estimated and Measured Battery Life

Next, an estimated life of the battery 1, which is estimated using Formula (1), was compared with a measured life. The battery used for the comparison was the battery 1 of AA size and 1000 mAh capacity. Intermittent charging was performed on the battery at a temperature of 40° C. during the charge phase. In the intermittent charging, when the battery voltage drops to 1.34 V or lower, the battery 1 is charged at 0.1 C for 1 hour to reach a full charge. During the discharge phase when the battery 1 is discharging, if the battery 1 outputs 2 W for 10 minutes at a temperature of 25° C., the battery 1 is considered as usable. In contrast, if the battery does not output 2 W of power for 10 minutes at a temperature of 25° C., the battery is considered to have reached the end of life. The battery determined to have reached the end of life is replaced with a new battery.

In this way, the battery 1 is charged when the battery voltage falls to 1.34 V or lower due to battery use or standing. Thus, the battery 1 is typically charged once in 4 days. A battery whose voltage has dropped to 1.34 V still has 90% of its capacity against a full charge. Then, 10% of the battery capacity will be charged by resuming charging. That is, in the present embodiment, when comparing an estimated life of the battery 1 with a measured life, one cycle represents a combination of a charge phase in which the battery 1 is charged to a full charge and a discharge phase in which the battery is discharged to a load to reduce its capacity to 90% of the full capacity. The phase that is neither the charge phase nor the discharge phase corresponds to a standing phase of the battery 1.

Table 1 shows a battery life estimated for each Example by measuring the saturation magnetization and an internal resistance of the battery after 3 months (Example 1), 6 months (Example 2), and 1 year (Example 3) from the start of battery use, and using Formula (1). As described above, since charging is performed once in 4 days, assuming that each month has 30 days, it is expected that 22 charges in 3 months of Example 1, 45 charges in 6 months of Example 2, and 91 charges in one year (365 days) of Example 3 are performed.

Figure 2:
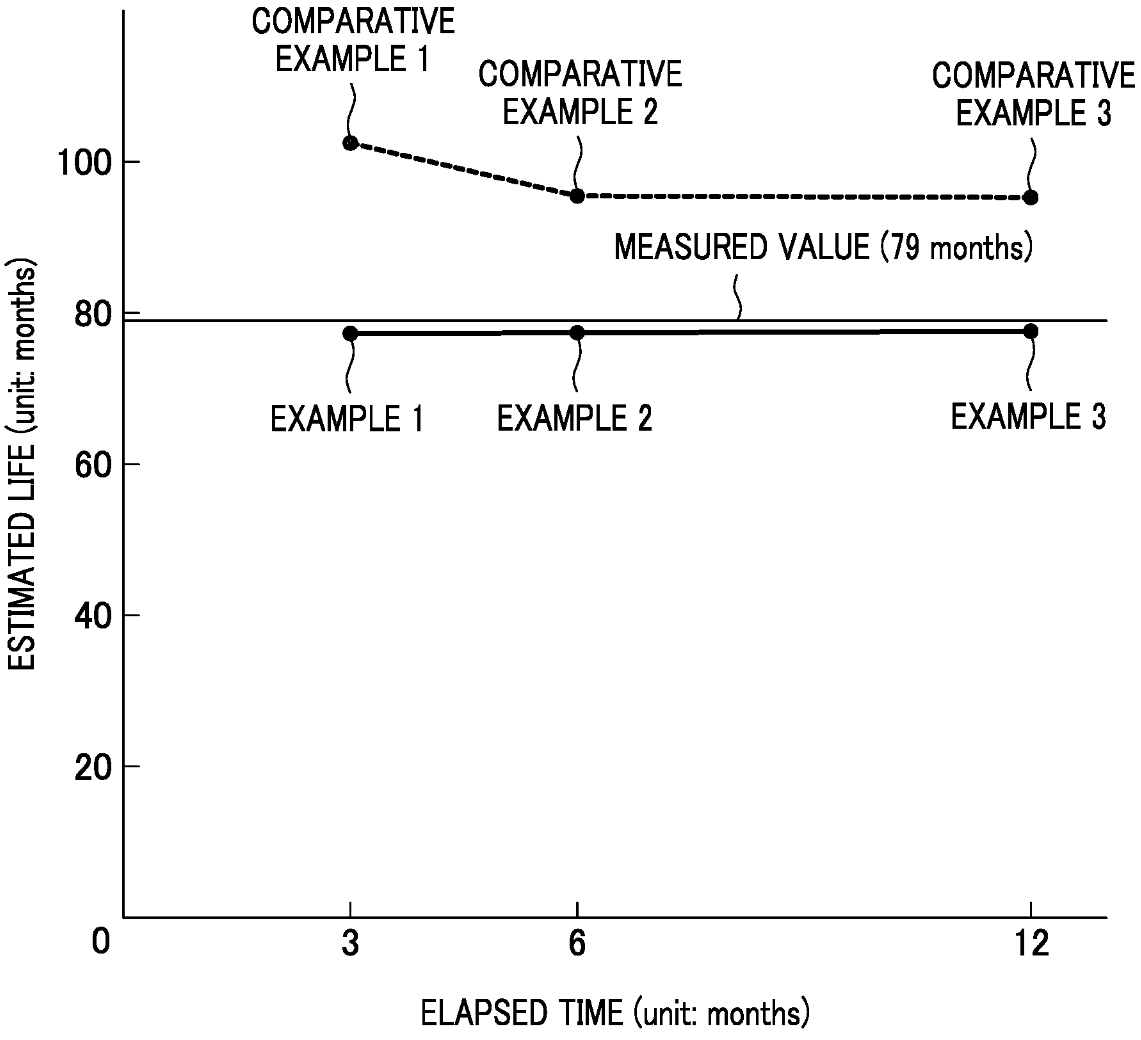
FIG. 2 is a graph illustrating the differences of the estimated battery life between the examples and comparative examples against the actual measured battery life.

For comparison, for each Example's battery, the portion (2) in Formula (1) which represents the increase in the surface area of the alloy particles due to the pulverization is replaced by 1, i.e. eliminating consideration of the increase in the surface area due to the pulverization. And the battery life after 3 months (Comparative Example 1), 6 months (Comparative Example 2), and one year (Comparative Example 3) are shown in Table 1 and FIG. 2.

TABLE 1

| Battery No. | Elapsed time (unit: months) | Number of cycles | Estimated life (unit: months) Example | Estimated life (unit: months) Comparative Example | Measured life (unit: months) |
|---|---|---|---|---|---|
| 1 | 3 | 22 | 77.3 | 102.5 | 79 |
| 2 | 6 | 45 | 77.4 | 95.5 | |
| 3 | 12 | 91 | 77.6 | 95.3 | |

The battery 1 is AA size with a capacity of 1000 mAh, and a measured life thereof was 79 months. When the increased surface area of the alloy particles due to the pulverization is taken into account, the estimated life of the battery 1 was 77.3 months for Example 1, 77.4 months for Example 2, and 77.6 months for Example 3. The error from the measured life was about 1.6 months. In contrast, when the increased surface area of the alloy particles is not taken into account, the estimated life of battery 1 is 102.5 months in Comparative Example 1, 95.5 months in Comparative Example 2, and 95.3 months in Comparative Example 3. In all of the Comparative Examples, the estimated life is longer than the measured life, and especially the estimated life of the battery whose elapsed time period was short from the start of battery use is longer than the measured life by 23.5 months, or nearly about 2 years.

Therefore, if the battery life is estimated without taking into account the increased surface area of the alloy particles, the battery may no longer be used before reaching the originally estimated time period, leading to unforeseen contingencies for equipment and facilities which the battery is used for.

Thus, if the life of the battery is estimated considering the increased surface area of the alloy particles due to the pulverization of the alloy particles in addition to the measured saturation magnetization of the negative electrode, the number of years closer to the actual measured value can be calculated. In addition, the estimated life is shorter than the measured life by 1.6 months, when the increased surface area of the alloy particles is taken into account. Therefore, the battery capacity can be used efficiently, and does not affect operation of equipment and facilities such a battery.

As a modeling of the increase in the surface area of the alloy particles, if the formula of the sum of geometric sequence from 1 cycle to N cycles, with $\alpha$, rate of increase in corrosion rate per cycle, as the first term, and $\sigma$, decrease rate of $\alpha$ per cycle, as the common ratio is employed, it can calculate an estimated battery life that is close to the actual measured battery life, in accordance with the measured value of saturation magnetization of the negative electrode plate in a short period, e.g. less than one year.

In the present disclosure, the precision of battery life estimation can be improved by calculating the corrosion of the hydrogen absorbing alloy particles separately for the charge/discharge phase of the battery and the standing phase in which the battery is neither charged nor discharged, and by taking into account the increased surface area of the alloy particles which increases as they are pulverized along with the number of cycles.

In the embodiment above, an AA-sized cylindrical battery was used, but the present disclosure can be applied to any suitable secondary battery that uses hydrogen absorbing alloy particles for the negative electrode mixture.

What is claimed is:

1. A method of estimating life of a nickel-metal hydride battery that accommodates a positive electrode plate and a negative electrode plate facing the positive electrode plate with a separator therebetween and contains a hydrogen absorbing alloy together with an electrolyte, wherein a charge phase of charging the nickel-metal hydride battery and a discharge phase of discharging the nickel-metal hydride battery after the charge phase constitute one cycle for charge/discharge of the nickel-metal hydride battery, the method comprising:

determining a rate of change after one charge/discharge cycle of a surface area of the negative electrode plate which is a boundary face in contact with the electrolyte, determining an amount of corrosion of the hydrogen absorbing alloy based on the rate of change accumulated for n charge/discharge cycles to estimate the life of the nickel-metal hydride battery based on the amount of corrosion, where n is a natural number, and determining an elapsed time period since a first charge phase by adding a time period of the charge phase and the discharge phase of the nickel-metal hydride battery and a time period of a standing phase in which the nickel-metal hydride battery is neither charged nor discharged between an i-th cycle and an (i+1)-th cycle, where i is a natural number less than n, wherein the rate of change is a rate of increase in the surface area during one charge/discharge cycle, and wherein the amount of corrosion of the hydrogen absorbing alloy is determined based on the rate of increase for n cycles measured for each cycle and the elapsed time period.

2. The method according to claim 1, wherein the amount of corrosion of the hydrogen absorbing alloy during the standing phase is estimated based on the number of n charge/discharge cycles, the rate of increase for n cycles measured for each cycle, and the elapsed time period.

* * * * *